United States Patent
Roberts, Jr.

(10) Patent No.: US 11,448,688 B2
(45) Date of Patent: Sep. 20, 2022

(54) METHOD FOR CONTINUOUS TESTER OPERATION DURING LONG SOAK TIME TESTING

(71) Applicant: CELERINT, LLC, New York, NY (US)

(72) Inventor: Howard H. Roberts, Jr., Austin, TX (US)

(73) Assignee: CELERINT, LLC, New York, NY (US)

( * ) Notice: Subject to any disclaimer, the term of this patent is extended or adjusted under 35 U.S.C. 154(b) by 0 days.

(21) Appl. No.: 17/258,977

(22) PCT Filed: Jul. 9, 2019

(86) PCT No.: PCT/US2019/041010
§ 371 (c)(1),
(2) Date: Jan. 8, 2021

(87) PCT Pub. No.: WO2020/014229
PCT Pub. Date: Jan. 16, 2020

(65) Prior Publication Data
US 2021/0341531 A1    Nov. 4, 2021

Related U.S. Application Data

(60) Provisional application No. 62/696,086, filed on Jul. 10, 2018.

(51) Int. Cl.
*G01R 1/067*    (2006.01)
*G01R 1/073*    (2006.01)
(Continued)

(52) U.S. Cl.
CPC ....... *G01R 31/2834* (2013.01); *G01R 1/0416* (2013.01); *G01R 31/003* (2013.01)

(58) Field of Classification Search
CPC .......... G01R 1/02; G01R 1/067; G01R 1/073; G01R 31/02; G01R 31/26; G01R 31/28
See application file for complete search history.

(56) References Cited

U.S. PATENT DOCUMENTS 7,242,207 B2    7/2007 Park
7,554,349 B2    6/2009 Kang et al.
(Continued)

OTHER PUBLICATIONS

International Search Report, dated Oct. 9, 2019 by the U.S. Patent and Trademark Office (USPTO), in International Application No. PCT/US2019/041010.

*Primary Examiner* — Neel D Shah
(74) *Attorney, Agent, or Firm* — Greenblum & Bernstein, P.L.C.

(57) ABSTRACT

Methods are provided that performs continuous semiconductor testing during long soak time testing using a chamberless single insertion model (SIM) handler and also using a chamberless asynchronous insertion model (AIM) handler having two manipulators. The methods include dividing a group of semiconductors having an ambient temperature into a first subgroup having a plurality of portions and a second subgroup having a plurality of portions, the second subgroup being identical to the first subgroup. The methods also include using thermal chucks to change the temperature of the first portion of the first subgroup and the first portion of a second subgroup prior to testing from ambient temperature to a stabilized designated temperature during a soak time. The methods also include testing all of the portions of the first subgroup and the second subgroup using predetermined protocols that include Soak Time, Test Time, Index Time, and sometimes Wait Time.

18 Claims, 12 Drawing Sheets

Multiplexed Handler Test Cell

(51) Int. Cl.
*G01R 31/28* (2006.01)
*G01R 1/04* (2006.01)
*G01R 31/00* (2006.01)

(56) References Cited

U.S. PATENT DOCUMENTS

| | | | |
|---|---|---|---|
| 7,633,288 B2 * | 12/2009 | Chung | G01R 31/2893 324/762.01 |
| 9,551,740 B2 | 1/2017 | Roberts | |
| 2008/0136436 A1 * | 6/2008 | Hong | G01R 31/2865 324/750.11 |

* cited by examiner

Chamberless Soak Time Test Cycle
(2 cycles shown)

FIG. 3
Mask Soak Time on SIM Handler
CASE 1: soak time <= test time
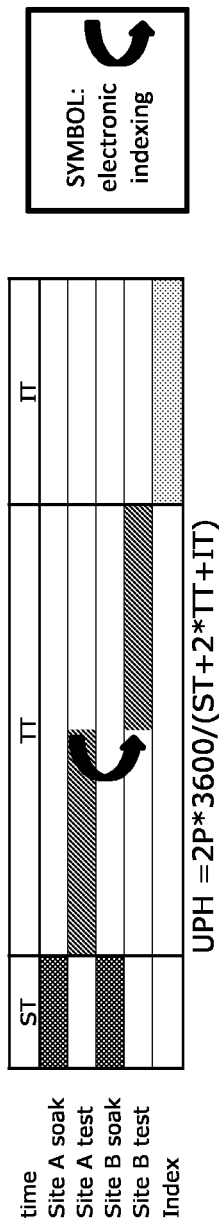
UPH = 2P*3600/(ST+2*TT+IT)
CASE 2: soak time > test time
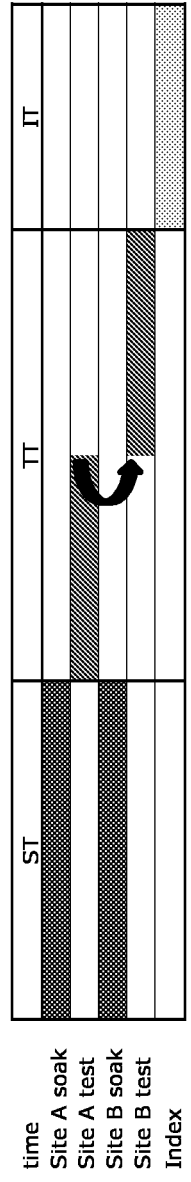
UPH = 2P*3600/(ST+2*TT+IT), same as CASE 1
SYMBOL: electronic indexing
Masked: 50% of the index cycles and 50% of the index soak cycles FIG. 4 UPH Improvement on SIM

FIG. 7     Mask Soak Time on AIM Handler

Multiplexed Handler Test Cell

METHOD FOR CONTINUOUS TESTER OPERATION DURING LONG SOAK TIME TESTING

CROSS-REFERENCE TO RELATED APPLICATION

This application claims the benefit of U.S. Provisional Patent Application No. 62/696,086 entitled "Method for Continuous Tester Operation During Long Soak Time Testing," filed on Jul. 10, 2018, the disclosure of which is incorporated by reference herein in its entirety.

TECHNICAL FIELD

The present disclosure is related to automated manufacturer systems and methods, particularly automated semiconductor test equipment and robotic handlers. In particular, the present disclosure is related to optimizing the configuration and methodology of operating automated semiconductor test equipment and robotic handlers to achieve nearly continuous semiconductor tester operation during long soak time testing of semiconductors. As a result of reduced soak and index timing delays, the overall total testing time is minimized, which optimizes semiconductor testing throughput.

BACKGROUND

Manufacturing and production industries use automatic test equipment (ATE) to analyze and assess integrity and operability of manufactured products at various stages of production. Robotic manipulator machines are often employed during testing by ATE to manipulate work pieces and products into and out of connection with the ATE. The semiconductor devices under test (DUTs) are presented to a test site of the ATE by the robotic machine, tested by the ATE, and then sorted and dispensed by the robotic machine into groups or bins (or otherwise according to an applicable scheme) according to test results. Because many diverse types of DUTs are tested by ATEs, and DUTs may be tested at various stages of production (e.g., final test, work piece probe, etc.), ATEs are varied in design according to the particular purpose, device, and/or product for testing. Similarly, robotic manipulator machines vary according to application and compatibility with the ATE.

Although varied, ATEs and robotic manipulators each usually include several typical operational units. ATEs and robotic manipulators are widely used, for example, in the production of electronic products, such as analog and digital components, circuits and devices (including semiconductors, integrated circuits, microprocessors, and the like). Because of this prevalence, the typical operational units of ATEs and robotic manipulators for such products are described.

The ATE includes a system controller, which controls the system and movement of data into and out of the system. The ATE also includes test data and test program storage, pattern memory, system power supplies, direct current reference supply unit, analog current reference supply unit, system clocks and calibration circuits, timing and time set memory, and precision measurement units (which may include digital, analog or mixed signal test resource circuitry). In addition, a test head of the ATE includes pin electronics driver cards providing pin circuitry (such as for comparators, current loads and other test resources) for pin electronics testing of DUTs. A device interface board (DIB) (also referred to as "load board) connects to the test head and provides connection socket(s) for the DUT or DUTs, as applicable. The ATE also includes external interfaces for connection to robotic manipulators for test devices (referred to as "handlers" or "device handlers"), as well as interfaces to computers, networks, and/or other instruments, devices or components.

Robotic manipulators, i.e., handlers, include mechanical systems and controllers. The mechanical systems physically deliver DUTs for presentation to the socket(s) of the DIB connected to the test head of the ATE, deposit the DUTs in the socket(s) during testing, remove the DUTs from the socket(s) post testing, and sort the DUTs according to respective test result after testing. The controller directs operations of the mechanical systems of the handler and communicates with the ATE. As required, handlers can include additional features of memory and specific units according to application and testing environment.

In conventional testing of devices by an ATE and mechanical manipulation of devices by a handler, the ATE commences testing each device when deposited by the handler in a socket of the DIB connected to the test head. When testing is completed, the handler must remove the tested device from the socket and transport a next device to the socket for testing. The time delay between testing by the ATE, during which devices are removed and transported from sockets and next devices are transported to and deposited in sockets, is referred to as "index time" for the test operation. Additionally, in conventional testing of devices by an ATE, the time required to test each device once deposited in a socket is referred to as "tester time" for the test operation. Furthermore, when the testing of semiconductor devices is to be conducted at any temperature above ambient temperature, additional time is required to heat the semiconductor devices to the designated temperature above the ambient temperature and to stabilize the semiconductor devices at the designated elevated temperature set point. This additional time is referred to as semiconductor device "soak time". Thus, when testing a batch of devices, the total time required for the testing operation is the aggregate of the index time, the soak time, and the tester time for all of the devices. Each device (or set of devices, if more than one device can be concurrently tested by the ATE in available sockets of the DIB) requires the sum of the index time, the soak time, and the tester time for testing of the device. Although testing operations can also require additional time, for example, because of downtime of equipment, faults, or other impediments to continuous testing sequence, these are irregular and uncertain events that are not necessarily controllable.

Therefore, reducing the total test time (soak time, index time, plus tester time) is desirable. Testing operations can require significant amounts of time, effort, and expense, such as for personnel, ATE, and handler equipment. ATEs are typically expensive because they are comprised of complex electronics. Handlers are generally less expensive than ATEs because mechanical pieces are controlled by less complex electronics. In efforts to receive greater returns on investments in ATEs and handlers, companies operating the equipment desire that idle times (periods of no testing) for this equipment be limited. Therefore, with ATEs and handlers, a reduction of total test time (index time, soak time, and tester time) can provide significant advantage. For example, if total test time is reduced, more testing can be performed by each piece of equipment and testing personnel during any period, leading to a greater investment return.

A primary focus in handler development has been to increase the speed of mechanical structures, such as arms, chucks, guides, cams and the like, in order to obtain shorter index times. Because handlers are generally less expensive than ATEs, older handler models are replaced with newer, speedier models. Older handlers become idle and obsolete. Handler mechanical failure is a significant source of testing downtime; therefore, excess handlers are often maintained as backup equipment, but stand idle during periods not in use with ATE for testing operations. It would be desirable to reduce total test time by the more effective and efficient use of ATEs and available handlers.

It would, therefore, be advantageous to reduce total test time for testing by reducing index time of handler/robotic manipulator operations and for reducing the soak time. It would also be advantageous to efficiently use ATE resources and available handlers to put to use idle equipment, maximize use of equipment capabilities, take advantage of available capacity (including capacity from existing older equipment), and consequently, provide a better return on investment. Therefore, a platform system for reducing total test time, by decreasing handler index time and soak time, and by efficiently using automatic test equipment resources, would be a significant improvement in the art and technology.

Frequently, semiconductors need to be tested at different temperatures to insure operational effectiveness and efficiency of the semiconductor. Testing semiconductors at multiple temperatures during a single semiconductor test insertion provides several benefits. Single semiconductor testing is characterized by inserting the semiconductor into a testing socket at the handler testing site and performing multiple tests at different temperatures before removing the semiconductor from the testing socket at the handler testing site. However, conventional testing protocols for testing have been characterized by significant amounts of index time.

Semiconductor pick-and-place handlers that can support temperature testing, either hot or cold, fall into two basic design categories: (1) Chambered handlers, and (2) Chamberless handlers. Chambered handlers soak large numbers of semiconductor devices in a chambered buffer that includes the test socket area. Chambered handlers typically do not modulate the temperature of the devices during testing to compensate for self-heating. Chamberless handlers bring the semiconductor device under test to a designated temperature by incorporating thermal forcing into the part of the handler manipulator system that makes physical contact with the semiconductor device and inserts the semiconductor device into the test site.

The part of the Chamberless handler manipulator system that makes contact with the semiconductor device is typically referred to as a thermal chuck. Since semiconductor devices self-heat during testing, thermal chucks first bring the semiconductor device to the designated temperature, and then modulate the designated temperature in order to hold the temperature at the desired set point as the semiconductor device self-heats and dissipates electrical power during testing. Active thermal management at the thermal chuck requires temperature measurement of the semiconductor device or semiconductor device package, and a feedback control system to compensate for self-heating.

The advantage of chamberless semiconductor handlers that have active thermal management at the chuck is that the temperature can be controlled during testing. Whether hot or cold temperature testing is being conducted, the thermal chuck cools the semiconductor device during test to compensate for self-heating. The disadvantage of chamberless semiconductor handlers is that the soak time is incurred during every testing cycle.

A representative example of a conventional chamberless soak time test cycle showing two cycles is illustrated in Prior Art FIG. 1. In Prior Art FIG. 1, each conventional chamberless soak time test cycle include three phases, including soak time, test time, and index time. After completion of the first three-phase conventional chamberless soak time test cycle, the second conventional chamberless soak time test cycle begins in sequential order. The actual temperature for the tests would be dependent upon the particular testing protocol being utilized. Soak time, which is illustrated as a ramp, refers to an indexing time period in which the handler ramps to a designated temperature different from the ambient temperature. In other words, ramping refers to increasing (or in some cases, decreasing) the temperature level from one temperature level to a different testing temperature level, while the semiconductor device remains inserted into a testing socket, but is not being tested. In this instance, time spent by the handler ramping from one temperature (e.g., ambient) to a testing temperature is characterized as soak time, i.e., time when the tester is soaking the semiconductor device to a designated temperature, and the tested is idle and is not performing testing.

Again referring to Prior Art FIG. 1, the illustrated sequence begins with a soak period wherein the handler ramps from an initial temperature, which is frequently the testing room (i.e., ambient) temperature, to a designated temperature (hot or cold) so that a designated test can be performed. Upon completion of the test, the sequential testing is complete for a first insertion cycle. In the second insertion cycle, the sequence begins again. The number "n" of insertion cycles for a particular test is determined by the size of the lot of the semiconductor devices to be tested divided by the degree of testing parallelism, which refers to the number of semiconductor devices that can be tested simultaneously by the tester and handler.

As described above in reference to Prior Art FIG. 1, for each semiconductor insertion cycle, which corresponds to a three-phase testing sequence, there is a ramping soak period, a testing period, and an index period. Thus, the total time spent soaking while testing the entire lot of semiconductor devices is the accumulation of the time accrued during the soaking period in each insertion cycle multiplied by the number of required insertion cycles. Dependent upon the capabilities of the handler, this total soaking time can be a significant source of inefficiency of the tester and handler that counteracts the benefits of conducting a single insertion test.

SUMMARY

As discussed above, semiconductors need to be tested at different temperatures to insure operational effectiveness and efficiency. Testing semiconductors at one or more temperatures during a single semiconductor test insertion provides several benefits, if the cumulative soaking and index times can be either minimized, or ideally, totally eliminated.

In view of these operational considerations, there is provided an innovative methodology for performing continuous semiconductor tester operation during long soak time testing of semiconductor devices. This methodology is characterized by substantially reducing soak time, and in some operational configurations, entirely eliminating soak time. More specifically, the testing protocol is configured such that multiple testing sequences of semiconductors are executed in parallel, while the soak time associated with the ramping periods is either substantially reduced or eliminated entirely.

In an embodiment, a method is provided for performing continuous semiconductor testing of semiconductors using a chamberless single insertion model (SIM) handler where the semiconductor testing requires long soak times. The method includes dividing a group of semiconductors having an ambient temperature into a first subgroup having a plurality of portions and a second subgroup having a plurality of portions, the second subgroup being identical to the first subgroup. The method also includes inserting, by the handler using chucks, a first portion of the first subgroup into a first test site, and inserting a first portion of a second subgroup into a second test site, and heating the first portion of the first subgroup and the first portion of a second subgroup prior to testing from ambient temperature to a stabilized designated temperature during a soak time. Additionally, the method includes electrically connecting the first portion of the first subgroup to the tester, and electrically disconnecting the first portion of the second subgroup from the tester, testing the first portion of the first subgroup, and electrically disconnecting the first portion of the first subgroup from the tester, and electrically connecting the first portion of the second subgroup to the tester. The method further includes testing the first portion of the second subgroup, electrically disconnecting the first portion of the second subgroup from the tester, and removing the first portion of the first subgroup from the first test site and the first portion of the second subgroup from the second test site.

In another embodiment, the method also includes using handler chucks that are thermal chucks.

In a further embodiment, the method further includes the heating of the first portion of the first subgroup and the first portion of the second subgroup prior to testing from the ambient temperature to the designated temperature by the thermal chucks.

In an embodiment, the method includes modulating the designated temperature of the heated first portion of the first subgroup and the heated first portion of a second subgroup semiconductor devices by the thermal chucks to maintain the designated temperature during testing of the semiconductor devices.

In another embodiment, the modulating the designated temperature includes measuring the temperature of a subgroup undergoing testing, and providing for a feedback control system to compensate for self-heating of the subgroup undergoing testing.

In a further embodiment, the method includes inserting, by the handler using chucks, a second portion of the first subgroup into a first test site, inserting a second portion of a second subgroup into a second test site, and repeating the method until all of the plurality semiconductors have been tested.

In an embodiment, the method for performing continuous semiconductor testing during long soak time testing using a single insertion model (SIM) handler that divides a group of semiconductors having an ambient temperature into a first subgroup having a plurality of portions and a second subgroup having a plurality of portions masks 50% of the overall Soak Time and 50% of the overall mechanical Index Time.

In another embodiment, a long soak time is defined as any soak time that reduces the operating throughput of a handler by more than 20%.

In a further embodiment, the first subgroup and the second subgroups have identical pin mappings and identical TDR calibration data.

In an embodiment, the testing of subgroups at the first testing site and second testing site is performed through a multiplexing scheme, with trace length matching for all pairs of multiplexed signals.

In another embodiment, a method for performing continuous semiconductor testing during long soak time testing using a chamberless asynchronous insertion model (AIM) handler using two manipulators is provided. The method includes dividing a group of semiconductors having an ambient temperature into a first subgroup having a plurality of portions and a second subgroup having a plurality of portions, the second subgroup being identical to the first subgroup. The method also includes inserting, by the handler using chucks, a first portion of the first subgroup into a first test site, and inserting a first portion of a second subgroup into a second test site, and heating the first portion of the first subgroup and the first portion of a second subgroup prior to testing from ambient temperature to a stabilized designated temperature during a soak time. Additionally, the method includes electrically connecting the first portion of the first subgroup to the tester, electrically disconnecting the first portion of the second subgroup from the tester, testing the first portion of the first subgroup. The method further includes electrically disconnecting the first portion of the first subgroup from the tester and removing the first portion of the first subgroup from the first test site, while electrically connecting the first portion of the second subgroup to the testing the first portion of the second subgroup, electrically disconnecting the first portion of the second subgroup from the tester, and removing the first portion of the second subgroup from the second test site.

In a further embodiment, the handler chucks are thermal chucks, and the heating of the first portion of the first subgroup and the first portion of the second subgroup prior to testing from the ambient temperature to the designated temperature was conducted by the thermal chucks.

In an embodiment, the method includes modulating the designated temperature of the heated first portion of the first subgroup and the heated first portion of a second subgroup semiconductor devices by the thermal chucks to maintain the designated temperature during testing of the semiconductor devices.

In another embodiment, modulating the designated temperature includes measuring temperature of a subgroup undergoing testing and providing for a feedback control system to compensate for self-heating of the subgroup undergoing testing.

In a further embodiment, the method includes inserting, by the handler using chucks, a second portion of the first subgroup into a first test site, and inserting a second portion of a second subgroup into a second test site; and repeating the method until all of the plurality semiconductors have been tested.

In an embodiment, the method for performing continuous semiconductor testing during long soak time testing using a single insertion model (AIM) handler partially masks the overall Soak Time and the overall mechanical Index Time when the Test Time is less than the sum of the Soak Time and the Index Time.

In another embodiment, the method for performing continuous semiconductor testing during long soak time testing using a single insertion model (AIM) handler fully masks the overall Soak Time and the overall mechanical Index Time when the Test Time equals the sum of the Soak Time and the Index Time.

In a further embodiment, the method for performing continuous semiconductor testing during long soak time testing using a single insertion model (AIM) handler fully masks the overall Soak Time and the overall mechanical Index Time when the Test Time is greater than the sum of the Soak Time and the Index Time, and introduces Wait Times into the method.

In an embodiment, a long soak time is defined as any soak time that reduces the operating throughput of a handler by more than 20%.

In another embodiment, the testing of subgroups at the first testing site and second testing site is performed through a multiplexing scheme, with trace length matching for all pairs of multiplexed signals

BRIEF DESCRIPTION OF THE DRAWINGS

FIG. 3 illustrates the masking of Soak Time using a SIM Handler in accordance with an embodiment of the invention;

DETAILED DESCRIPTION

Figure 1:
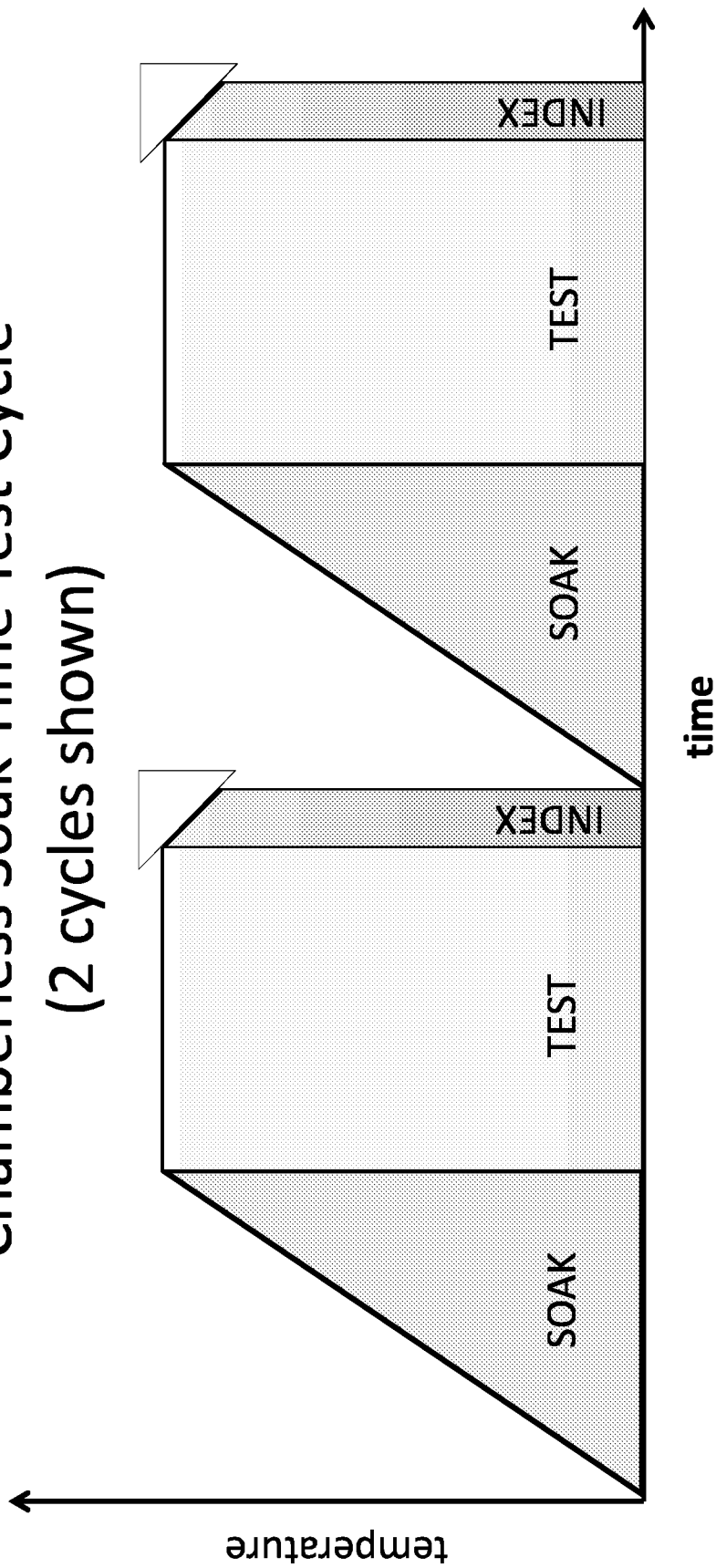
FIG. 1 provides an illustration of two sequential prior art chamberless soak time testing cycles, each cycle including Soak Time, Test Time, and Index Time.

In view of the foregoing, the present disclosure, through one or more of its various aspects, embodiments and/or specific features or sub-components, is thus intended to bring out one or more of the advantages as specifically noted below.

During the description of the invention, a number of acronyms will be used. Thus, the following Glossary provides definitions of notable acronyms:
SIM: Single Insertion Model
AIM: Asynchronous Insertion Model (AIM handler is referred to as a Dual Independent Manipulator Handler (DIMH) in Applicant's previous U.S. Pat. No. 7,183,785, herein incorporated by reference.)
UPH: units per hour, a measure of throughput
LST: long soak time
P: parallelism, the number of semiconductor devices tested at the same time by the tester
ST: soak time, the time it takes for a semiconductor device to change from a starting temperature (generally the ambient temperature) to the set point temperature for test
TT: test time, the time it takes to test one semiconductor device or a group of semiconductor devices
IT: index time, the time between the end of test and the next start of test
Chuck: the part of the handler manipulator system that contacts and handles the semiconductor device at the core where semiconductor devices are inserted into test sockets for testing
Thermal Chuck: a chuck that forces temperature change of the semiconductor device being handled
DUT: Device Under Test, the semiconductor device inserted into a test sockets and undergoing electrical and functional testing
PCB: Printed Circuit Board, a planar piece of hardware that mechanically supports and electrically connects components in a system of communicative and interactive electronics
DIB: DUT Interface Board (also known as a "load board", the PCB and test sockets that interface the semiconductor device under test to the tester
Test Socket: a receptacle into which DUTs are inserted for testing that mechanically stabilizes the DUTs and provides electrical connection to the DIB
Site: a "site" or "test site" is a location on the DIB comprised of one or more test sockets
Test Cell: the fundamental unit of production on a semiconductor test facility comprised of tester and a robotic device handler
ATE: Automatic Test Equipment For the discussion of the disclosed invention, a "long soak time" is generally defined as any soak time that reduces the operating throughput of a semiconductor handler by more than 20%.

The present disclosure provides a description of a method for performing continuous semiconductor tester operations that include long soak time testing, which is characterized by substantially reducing soak, and in some operational configurations, entirely eliminating soak time. The method also includes reducing index time, and in some operational configurations, entirely eliminating index time.

For instance, this type of a testing protocol eliminates semiconductor lot processing and staging between tests, thereby reducing the overall time to fully test product devices. This protocol also reduces robotic handling, thereby reducing the potential for electrostatic discharge damage (ESD) and mechanical damage to the semiconductor device. Semiconductor device insertions into testing sockets are reduced, thereby increasing the test cycle lifetime of the test sockets and the moving parts inside the robotic handler. The precision of the test data is also improved due to the fact that only one semiconductor tester is involved, thereby eliminating tester-to-tester variations when multiple semiconductor testers are used. This protocol greatly simplifies data management and substantially improves data utility, since data from multiple temperature tests is traceable to a single testing device, test socket, device interface board (DIB), robotic handler, and tester minimal post-processing overhead.

However, there are special considerations for semiconductor testing involving continuous semiconductor tester operations during long soak time testing. For instance, the robotic handler must be able to ramp during the soak time to the designated temperature(s) (i.e., increase or decrease from one temperature level to a different temperature level) while the semiconductor device remains inserted into a testing socket. Additionally, the soak time must be short enough in duration so that the benefits of single insertion testing are not significantly diluted by the additional ramp time. Binning must also be managed to compile multiple test results into a final composite outcome. Furthermore, the tester must be able to support the additional computer code and test vector load. The communication interface must support commands to sequence temperature ramps that are test site specific. The test program must also be able to execute the multiple tests in sequence and compile the final software bin result based on the outcome of each individual temperature test. Further for optimal efficiency, each robotic handler needs to be able to control multiplexing of multiple semiconductor test groups during execution of the testing protocol.

In the invention, the soak time for each testing sequence can be "masked," i.e., operationally hidden, if the testing methodology is engineered such that the semiconductor tester is operationally testing a subgroup of semiconductor devices during each temperature soak period. One solution to performing this type of testing methodology is to utilize multiplexing between a subgroup of semiconductor test sites performing ramping and a different subgroup of test sites performing testing. In a testing system configured with one robotic handler that tests two subgroups simultaneously, the robotic handler to support twice the executed parallelism of the semiconductor application testing program. These subgroups are herein designed as "Subgroup A" and "Subgroup B". Thus, the robotic handler in this dual subgroup testing configuration would result in the insertion of twice the number of semiconductor devices into handler testing sockets at a given time than a robotic handler in a single group testing configuration.

In the robotic handler dual subgroup testing configuration, the soak time can be full masked when the operational testing time is equal in duration or longer in duration than the soaking time. In other testing protocols, the soaking time can be substantially masked when the operations testing time is shorter in duration than the soaking time. Thus, the amount of soak time that can be masked depends on the ratio of test time to soak time and index time.

In semiconductor testing using the robotic handler dual subgroup testing configuration, the semiconductor insertion testing sequence preferably starts at room (i.e., ambient) temperature, if possible, since this starting temperature avoids an initial unmasked ramping period at the start of the insertion testing sequence.

In this configuration, the two subgroups of semiconductor testing sockets have identical pin mappings. They also have an identical Time Domain Reflectometry (TDR) which allows the test to launch signals at different times so that signals across all signal paths arrive at the same point in time. After the TDR calibration is completed, the tester can measure signals at different times so that signal across all signal paths are recorded at the same time relative to when they were sent. TDR calibration compensates for signal paths that differ in length.

In the robotic handler dual subgroup testing configuration, the robotic handler controls the multiplexing. The corresponding set of commands handles multiple start of test (SOT) and end of test (EOT) events. This set of commands also controls semiconductor binning, and the temperature soak sequencing.

The amount of throughput increase depends upon the amount of soak time that can be masked as well as the type of pick-and-play handler that is in use. There are two general types of pick-and-play handlers. The first type of pick-and-play handler is a single test site insertion model, which have one or more core manipulators wherein one or all insert devices for test at the same time (Single Insertion Model or SIM). The second type of pick-and-play handler is a Dual asynchronous manipulator model capable of asynchronous and overlapping insertion, which has two manipulators where each manipulator can insert semiconductor devices independently of the other manipulator (Asynchronous Insertion Model or AIM).

Single Insertion Model Handlers

There are several key features of Single Insertion Model Handlers (SIM Handlers), including the fact that they are typically chamberless. Additionally, single test site insertion model handlers frequently have one or more core manipulators, where one or all of these core manipulators insert semiconductor devices for testing at the same time. Furthermore, single test site insertion model handlers have active thermal management at the chuck. This refers to the fact that the thermal chuck touches and handles the semiconductor devices at the core where the semiconductor devices are inserted into test sockets for testing. Single test site insertion model handlers also support twice the parallelism of the standard application running on them prior to being converted to long soak time testing with multiplexing and electronic indexing.

In conventional SIM Handler Test Flow involving a long soak time, the SIM Handler gets a first set of semiconductor devices P, and inserts the P semiconductor devices into test sockets, which represents the number of semiconductor devices tested at the same time by the tester. The SIM Handler then soaks all of the semiconductor devices until they are stabilized at a designated set point temperature. All of the semiconductor devices are then tested by the tester. When the testing is completed, the SIM Handler removes the P semiconductor devices and moves them to the next staging area. The SIM Handler then gets the next set of P semiconductor devices for testing. This period of time when testing is not being performed because the SIM Handler is moving the different sets P of semiconductor devices between testing periods is referred to a "mechanical index time". In the conventional SIM Handler Test Flow, this sequence is repeated until all of the P sets of semiconductor devices have been tested.

Figure 2:
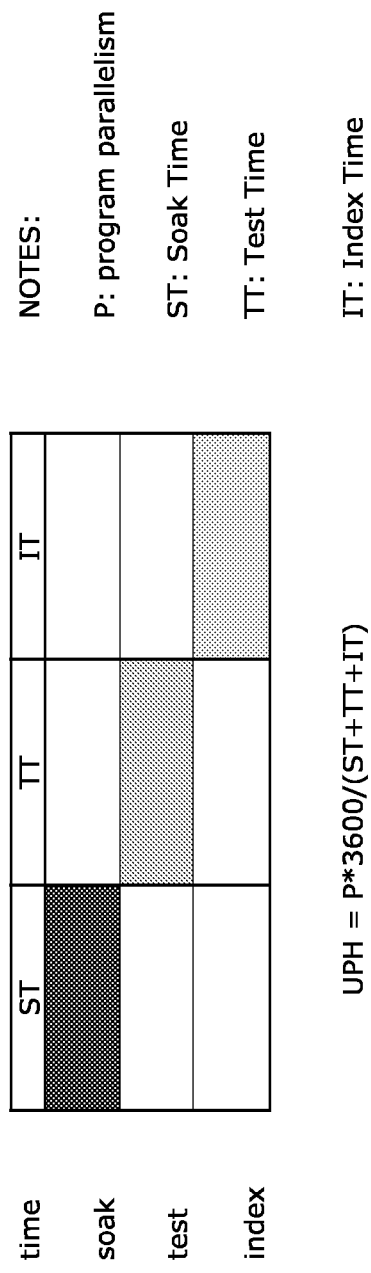
FIG. 2 provides a prior art illustration of the conventional masking of Soak Time using a SIM Handler.

The conventional SIM Handler Test Flow involving a long soak time is illustrated in Prior Art FIG. 2. This figure illustrates the conventional Test Flow characterized by three sequential periods, which includes Soak Time (ST), Test Time (TT), and Index Time (IT). In this conventional SIM Handler Test Flow, the hourly throughput measure (UPH) is represented by the number of units, i.e., semiconductor devices P, that complete the ST, TT, IT test cycle per hour. Thus, the conventional SIM Handler Test Flow is represented by the throughput equation:

$$UPH=P*3600/(ST+TT+IT)$$

where the units per hour (UPH) equals the number of semiconductor devices tested at the same time by the tester (P) multiplied by the expression 3600 (the number of seconds in an hour) divided by the sum of the Soak Time (ST), Test Time (TT), and Index Time (IT).

In contrast, in the inventive SIM Handler Test Flow involving a long soak time, the SIM Handler gets a first set of semiconductor devices representing 2P semiconductor devices, and inserts the 2P semiconductor devices into 2P test sockets multiplexed as two identical semiconductor groups, i.e., group A and group B, where 2P represents the number of semiconductor devices tested at the same time by the tester. The SIM Handler then soaks all of the semiconductor devices 2P, which are the combined group A and group B, until both group A and group B are stabilized at a designated set point temperature. At this point in the overall testing cycle, semiconductor device group A is connected to the tester for testing, whereas the semiconductor group B is electrically disconnected from the tester. When the testing of semiconductor group A is completed, the tester electronically indexes to semiconductor group B. This electronic indexing means that semiconductor device group A is electrically disconnected from the tester, and semiconductor device group B is electrically connected to the tester. The tester then proceeds to test semiconductor device group B. When testing of semiconductor device group B is completed, the SIM Handler removes the 2P semiconductor devices comprising semiconductor device group A and semiconductor device group B and moves the 2P semiconductors devices to the next staging area. The SIM Handler then gets the next set of 2P semiconductor devices for testing. This period of time when testing is not being performed because the SIM Handler is moving the different sets 2P of semiconductor devices between testing periods is referred to a "mechanical index time". In the inventive SIM Handler Test Flow involving a long soak time, this sequence is repeated until all of the 2P sets of semiconductor devices have been tested.

The inventive SIM Handler Test Flow involving a long soak time is illustrated in FIG. 3. This figure illustrates the inventive Test Flow that is characterized by three sequential periods, which includes Soak Time (ST), Test Time (TT), and Index Time (IT). FIG. 3 discloses two different cases, which includes Case 1 wherein the Soak Time (ST) is less than the Test Time (TT), and Case 2 wherein the Soak Time (ST) is greater than the Test Time (TT). In both Case 1 and Case 2 of the inventive SIM Handler Test Flow, the hourly throughput measure (UPH) is represented by the number of units, i.e., semiconductor devices 2P, that sequentially complete the ST, TT, IT test cycle per hour. Thus, the inventive SIM Handler Test Flow is represented by the throughput equation:

$$UPH=2P*3600/(ST+2*TT+IT)$$

where the units per hour (UPH) equals the number of semiconductor devices sequentially tested by the tester (2P) multiplied by the expression 3600 (the number of seconds in an hour) divided by the sum of the Soak Time (ST), twice the Test Time (2TT), and Index Time (IT). Thus, the inventive SIM Handler Test Flow involving a long soak time masks 50% of the Index Time (IT) and 50% of the Soak Time (ST), resulting in a significantly greater productivity throughput UPH.

Figure 4:
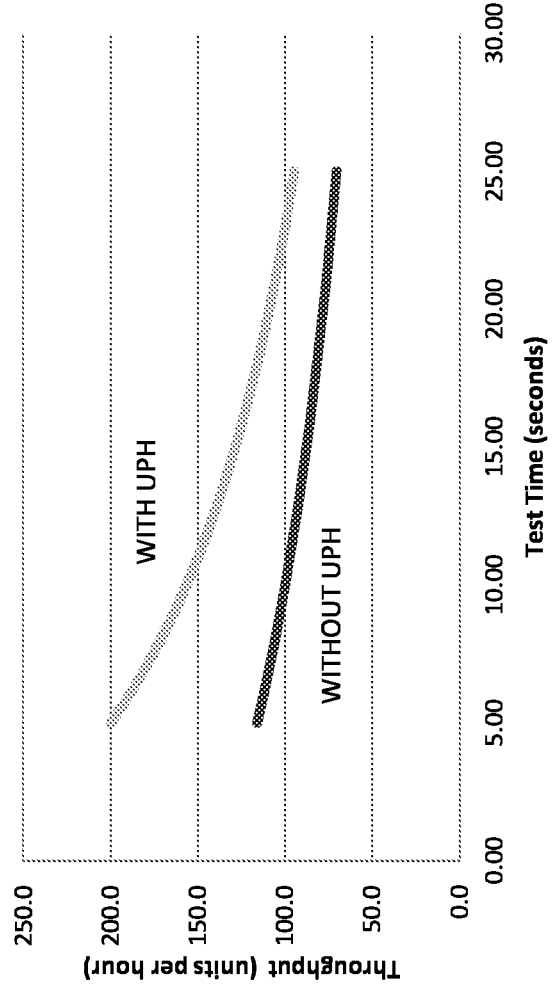
FIG. 4 illustrates the UPH improvement using SIM.

FIG. 4 is a graphical illustration of greater productivity throughput achieved by the inventive SIM Handler Test Flow involving a long soak time in a representative case where the Index Time (IT) is a constant 2 seconds and the Soak Time (ST) is a constant 24 seconds. FIG. 4 shows that as the productivity Throughput achieved by the inventive SIM Handler Test Flow using multiplexing and electronic indexing is clearly more productive than a SIM Handler Test Flow without using multiplexing and electronic indexing. As shown in FIG. 4, the productivity Throughput differential dramatically increases the shorter the Test Time (TT) in comparison to the fixed Index Time (IT) and fixed Soak Time (ST).

Figure 5:
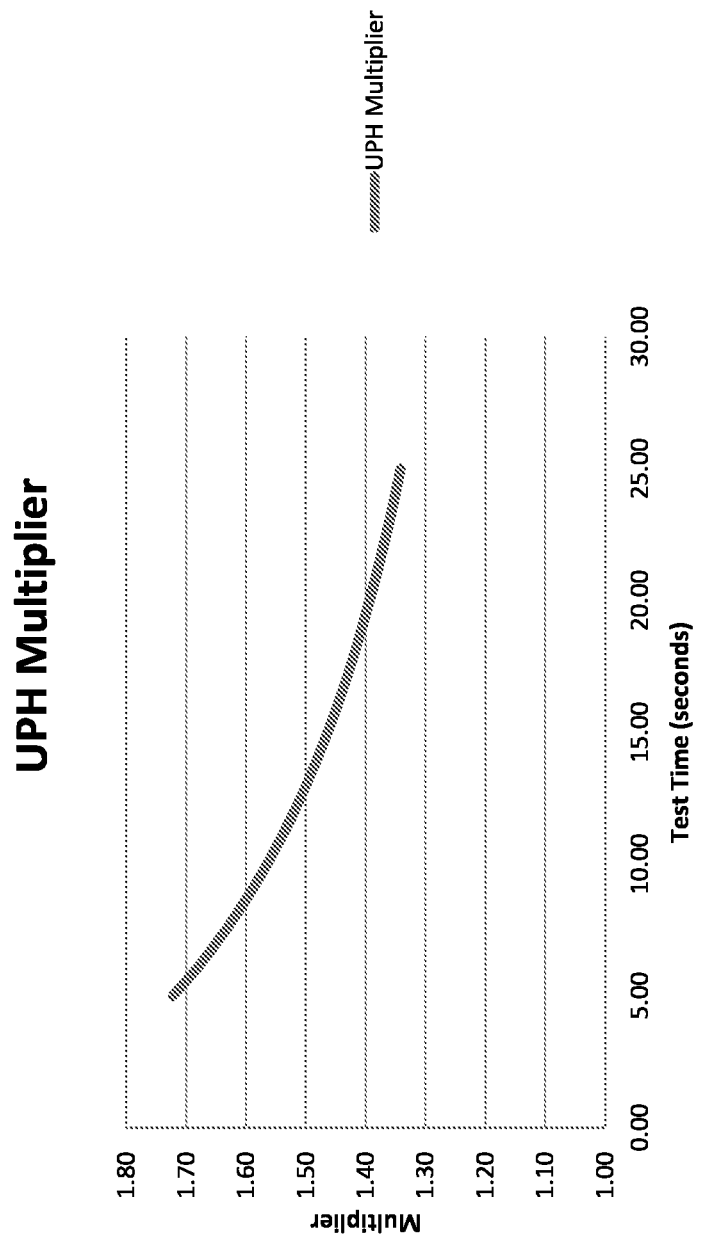
FIG. 5 illustrates the UPH Multiplier using a SIM Handler with multiplexing and electronic indexing.

FIG. 5 illustrates the dramatic increase in productivity Throughput achieved in the scenario shown in FIG. 4 as a Multiplier of the increase in productivity Throughput achievable by the inventive SIM Handler Test Flow involving a long soak time. As shown in FIG. 5, the increased productivity multiplier range from 1.40 at a 20 second Test Time (TT) to 1.70 at a 5.00 second Test Time (TT). This represents a productivity Throughput increase ranging from 40% to 70%.

The following provides some key points relating to the inventive SIM Handler Test Flow with multiplexing and electronic indexing involving a long soak time. When the Soak Time (ST) is equal to the Test Time (TT) plus Index Time (IT), the increase in inventive SIM Handler Test Flow with multiplexing and electronic indexing involving a long soak time productivity throughput is always equal to 1.33×, which represents a 33% increase in productivity throughput. However, as the Index Time (IT) and Test Tim (TT) approach zero seconds, the maximum increase in productivity throughput approaches 2×, which represents a 100% increase in productivity throughput.

The inventive SIM Handler Test Flow with multiplexing and electronic indexing involving a long soak time requires a SIM Handler that supports 2× (two times) the parallelism of the standard application. The inventive SIM Handler Test Flow with multiplexing and electronic indexing involving a long soak time also requires a new Device Under Test Interface Board (DIB) that provides 2× (twice) the number of semiconductor device test sockets, where the test sockets are partitioned into two multiplexed subgroups connected to the tester via a 2:1 multiplexing scheme. Additionally, all pairs of multiplexed signals need to be trace length matched. There further needs to be an executive control code running with the test program that handles multiplexing and binning.

Asynchronous Insertion Model Handlers

There are several key features of Asynchronous Insertion Model Handlers (AIM Handlers), including the fact that they are typically chamberless. Additionally dual asynchronous manipulator handlers are capable of asynchronous and overlapping semiconductor device insertion, and are provided with two manipulators where each manipulator is configured to insert semiconductor devices independently of each other. Furthermore, asynchronous insertion model handlers have active thermal management at the chuck. This refers to the fact that the thermal chuck touches and handles the semiconductor devices at the core where the semiconductor devices are inserted into test sockets for testing. Asynchronous insertion model handlers also support twice the parallelism of the standard application running on them prior to being converted to long soak time testing with multiplexing and electronic indexing.

In conventional AIM Handler Test Flow involving a long soak time, the AIM Handler gets a first set of semiconductor devices P, and inserts the P semiconductor devices into test sockets, where represents the number of semiconductor devices tested at the same time by the tester. The AIM Handler then soaks all of the semiconductor devices until they are stabilized at a designated set point temperature. All of the semiconductor devices are then tested by the tester. When the testing is completed, the AIM Handler removes the P semiconductor devices and moves them to the next staging area. The AIM Handler then gets the next set of P semiconductor devices for testing. This period of time when testing is not being performed because the AIM Handler is moving the different sets P of semiconductor devices between testing periods is referred to a "mechanical index time". In the conventional AIM Handler Test Flow, this sequence is repeated until all of the P sets of semiconductor devices have been tested.

Figure 6:
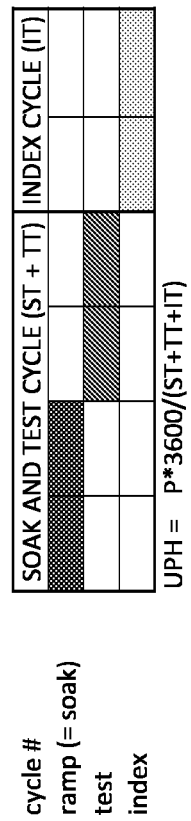
FIG. 6 is a Prior Art illustration of the masking of Soak Time using an AIM Handler.

The conventional AIM Handler Test Flow involving a long soak time is illustrated in Prior Art FIG. 6. This figure illustrates the conventional Test Flow characterized by three sequential periods, which includes Soak Time (ST), Test Time (TT), and Index Time (IT). In this conventional AIM Handler Test Flow, the hourly throughput measure (UPH) is represented by the number of units, i.e., semiconductor devices P, that complete the ST, TT, IT test cycle per hour. Thus, the conventional AIM Handler Test Flow is represented by the throughput equation:

$$UPH=P*3600/(ST+TT+IT)$$

where the units per hour (UPH) equals the number of semiconductor devices tested at the same time by the tester (P) multiplied by the expression 3600 (the number of seconds in an hour) divided by the sum of the Soak Time (ST), Test Time (TT), and Index Time (IT).

In contrast, in the inventive AIM Handler Test Flow involving a long soak time, the AIM Handler gets a first set of semiconductor devices representing 2P semiconductor devices, and inserts the 2P semiconductor devices into 2P test sockets multiplexed as two identical semiconductor groups, i.e., group A and group B, where 2P represents the number of semiconductor devices tested at the same time by the tester. The AIM Handler then soaks all of the semiconductor devices 2P, which are the combined group A and group B, until both group A and group B are stabilized at a designated set point temperature. At this point in the overall testing cycle, semiconductor device group A is connected to the tester for testing, whereas the semiconductor group B is electrically disconnected from the tester. When the testing of semiconductor group A is completed, the tester electronically indexes to semiconductor group B. This electronic indexing means that semiconductor device group A is electrically disconnected from the tester, and semiconductor device group B is electrically connected to the tester. The tester then proceeds to test semiconductor device group B. When testing of semiconductor device group B is completed, the AIM Handler removes the 2P semiconductor devices comprising semiconductor device group A and semiconductor device group B and moves the 2P semiconductors devices to the next staging area. The AIM Handler then gets the next set of 2P semiconductor devices for testing. This period of time when testing is not being performed because the AIM Handler is moving the different sets 2P of semiconductor devices between testing periods is referred to a "mechanical index time". In the inventive AIM Handler Test Flow involving a long soak time, this sequence is repeated until all of the 2P sets of semiconductor devices have been tested.

Figure 7:
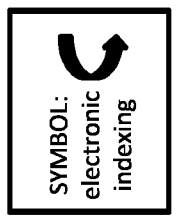
FIG. 7 illustrates the masking of Soak Time using an AIM Handler in accordance with an embodiment of the invention.

The inventive AIM Handler Test Flow involving a long soak time with multiplexing and electronic indexing on an AIM Handler is illustrated in FIG. 7. This figure illustrates the inventive Test Flow which is characterized by three sequential periods, which includes Soak Time (ST), Test Time (TT), and Index Time (IT). Additionally, in certain cases a Wait Time (WT) is required.

FIG. 7 discloses three different cases, which includes Case 1 where the Test Time (TT) is less than the sum of the Soak Time (ST) and the Index Time (IT), a Case 2 wherein the Test Time (TT) is equal to the sum of the Soak Time (ST) and the Index Time "IT), and a Case 3 wherein the Test Time (TT) is greater than the sum of the Soak Time (ST) and the Index Time (IT). The need for a Wait Time (WT) is introduced in Case 3.

In Case 1 where the Test Time (TT) is less than the sum of the Soak Time (ST) and the Index Time (IT), Sites A and B are concurrently conducting Soak Time (ST). Upon completion of the Soak Time (ST) in Sites and B, Site A conducts Test Time (TT), while Site B is electronically indexing, i.e., being electronically disconnected from the tester. Upon completion of the Test Time (TT) on Site A, the Tester begins Test Time (TT) on Site B while Site A begins Index Time (IT). Upon completion of Test Time (TT) at Site B, Site B begins Index Time (IT) while Site A continues Index Time (IT). The composite testing process continues with test cycle #2 and test cycle #3 sequentially following the test cycle #1, i.e., the first test cycle.

In Case 1 of the inventive AIM Handler Test Flow with long soak time, the hourly throughput measure (UPH) is represented by the number of units, i.e., semiconductor devices 2P, that sequentially complete the ST, TT, IT test cycle per hour. Thus, the inventive SIM Handler Test Flow is represented by the throughput equation:

$$UPH=2P*3600/(2*TT+[IT+ST-TT])=2P*3600/(TT+IT+ST)$$

where the units per hour (UPH) equals the number of semiconductor devices sequentially tested by the tester (2P) multiplied by the expression 3600 (the number of seconds in an hour) divided by the sum of the Soak Time (ST), the Test Time (2TT), and the Index Time (IT). Thus, the inventive AIM Handler Test Flow involving a long soak time partially masks the Index Time (IT) and the Soak Time (ST), resulting in a significantly greater productivity throughput UPH.

FIG. 7 also discloses Case 2 of the inventive AIM Handler Test Flow with Multiplexing and Electronic Indexing with long soak time wherein the Test Time (TT) is equal to the sum of the Soak Time (ST) and the Index Time "IT). Thus, in Case 2 the inventive SIM Handler Test Flow is represented by the throughput equation:

$$UPH=2P*3600/(2*TT)=P*3600/TT$$

where the units per hour (UPH) equals the number of semiconductor devices sequentially tested by the tester (2P) multiplied by the expression 3600 (the number of seconds in an hour) divided by the sum of the Soak Time (ST), the Test Time (2TT), which reduces to P*3600/TT. Thus, the inventive AIM Handler Test Flow involving a long soak time fully masks the Index Time (IT) and the Soak Time (ST), resulting in a significantly greater productivity throughput UPH.

FIG. 7 further discloses Case 3 of the inventive AIM Handler Test Flow with Multiplexing and Electronic Indexing with long soak time wherein the Test Time (TT) is greater than the sum of the Soak Time (ST) and the Index Time "IT). Thus, in Case 3 the inventive SIM Handler Test Flow is represented by the throughput equation:

$$UPH=2P*3600/(2*TT)=P*3600/TT$$

where the units per hour (UPH) equals the number of semiconductor devices sequentially tested by the tester (2P) multiplied by the expression 3600 (the number of seconds in an hour) divided by the sum of the Soak Time (ST), the Test Time (2TT), which reduces to P*3600/TT. Thus, the inventive AIM Handler Test Flow involving a long soak time fully masks the Index Time (IT) and the Soak Time (ST), while introducing Wait Time (WT), resulting in a significantly greater productivity throughput UPH.

Figure 8:
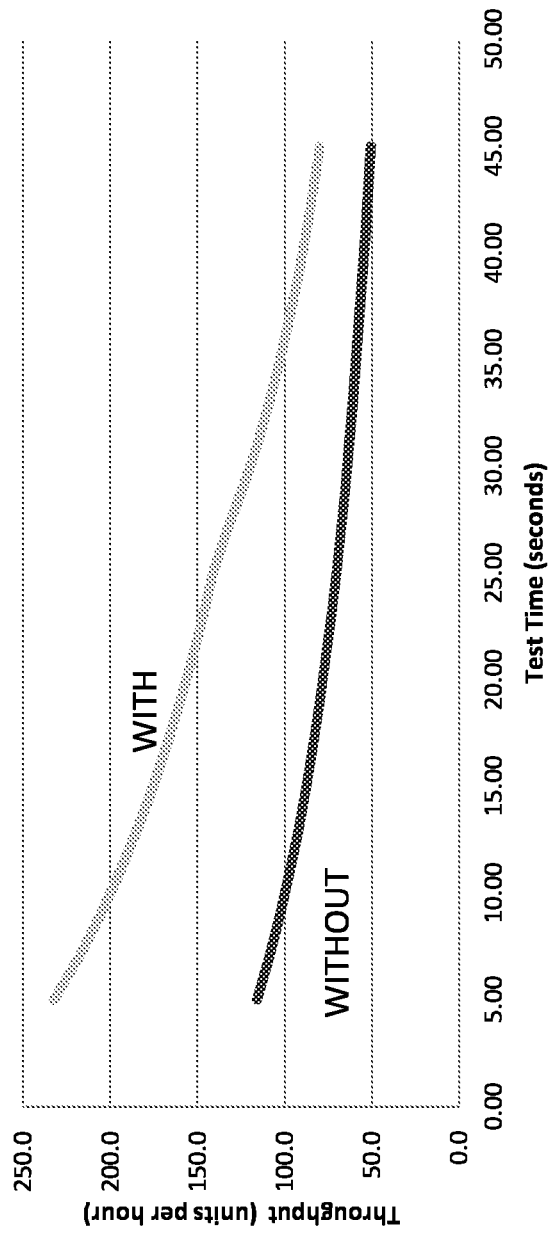
FIG. 8 illustrates the UPH improvement using AIM.

FIG. 8 is a graphical illustration of greater productivity throughput UPH improvement achieved by utilizing multiplexing and electronic indexing in AIM Handler Test Flow involving a long soak time. Illustrated in FIG. 8 is a representative case where the Index Time (IT) is a constant 2 seconds and the Soak Time (ST) is a constant 24 seconds. FIG. 8 shows that as the productivity throughput achieved by the inventive AIM Handler Test Flow using multiplexing and electronic indexing is clearly more productive than an AIM Handler Test Flow without using multiplexing and electronic indexing. As shown in FIG. 8, the productivity throughput differential dramatically increases the shorter the Test Time (TT) in comparison to the fixed Index Time (IT) and fixed Soak Time (ST).

Figure 9:
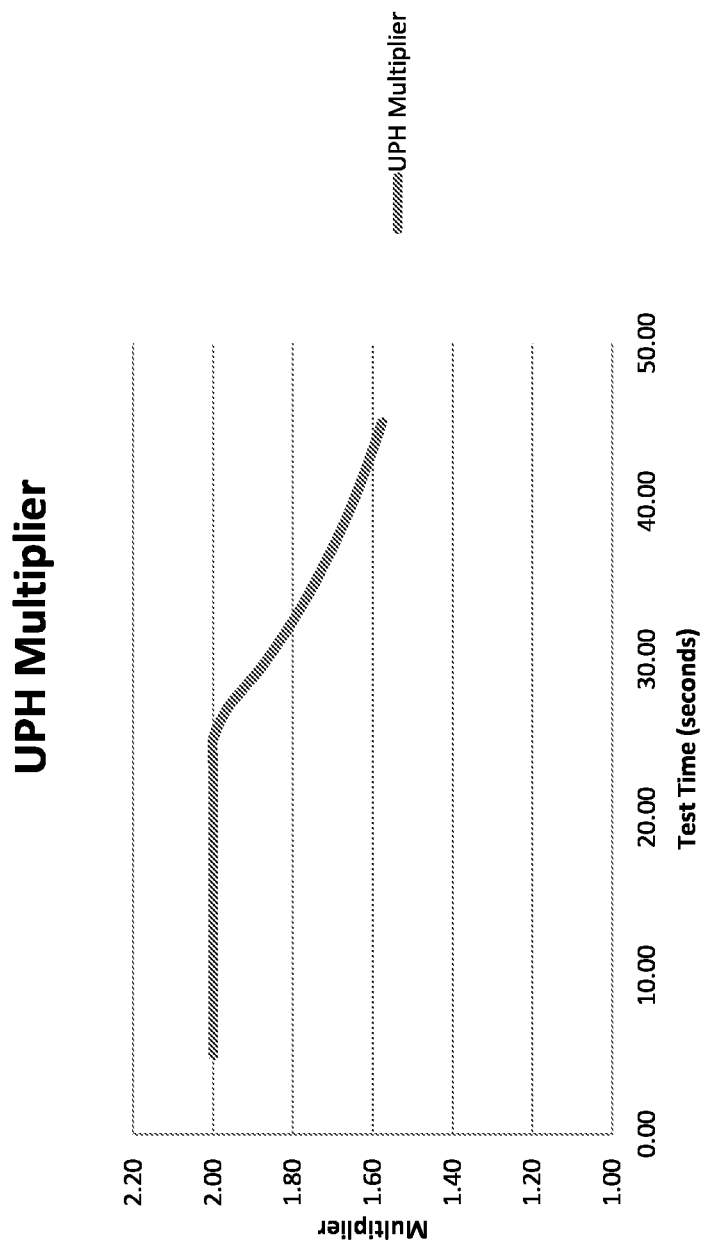
FIG. 9 illustrates the UPH Multiplier using an AIM Handler with multiplexing and electronic indexing.

FIG. 9 illustrates the dramatic increase in productivity throughput achieved in the scenario shown in FIG. 8 as a Multiplier of the increase in productivity throughput achievable by the inventive AIM Handler Test Flow using multiplexing and electronic indexing involving a long soak time. As shown in FIG. 9. the increased productivity multiplier range from about 1.60 at a 40 second Test Time (TT) to 2.00 in the range of 5.00 seconds to 25 seconds Test Time (TT). This represents a productivity throughput increase ranging from 60% to 100%.

The following provides some key points relating to the inventive AIM Handler Test Flow with multiplexing and electronic indexing involving a long soak time. When the Test Time (TT) is less than the Soak Time (ST) plus the Index Time (IT), the test program can be increased in duration and coverage with no penalty to productivity throughput, which remains at 2× (two times) of the standard AIM Handler Test Flow setup. Alternatively, when the Test Time (TT) is greater than the Soak Time (ST) plus the Index Time (IT), the Soak Time (TT) and the Index Time (IT) are fully masked. The tester runs continuously, however, Wait Time (WT) is introduced. Thus, the productivity throughput is Test Time (TT) dependent.

The implementation requirements include an AIM Handler that can execute the inventive AIM Handler Test Flow with multiplexing and electronic indexing involving a long soak time. This AIM Handler needs to support 2× (two times) the parallelism of the standard implementation. A Device Under Test Interface Board (DIB) would need 2× (two times the number of test sockets, with the test sockets partitioned into two multiplexed subgroups connected to the tester via a 2:1 multiplexing scheme. All pairs of the multiplexed signals need to be trace length matched. Additionally the tester needs to have the capability to execute executive control code running with the semiconductor device test program that handles the multiplexing and binning.

The following provides some key points relating to the inventive AIM Handler Test Flow with multiplexing and electronic indexing involving a long soak time. When the Soak Time (ST) is equal to the Test Time (TT) plus Index Time (IT), the increase in productivity throughput is always equal to 1.33×, which represents a 33% increase in productivity throughput. However, as the Index Time (IT) and Test Tim (TT) approach zero seconds, the maximum increase in productivity throughput approaches 2×, which represents a 100% increase in productivity throughput.

Figure 10:
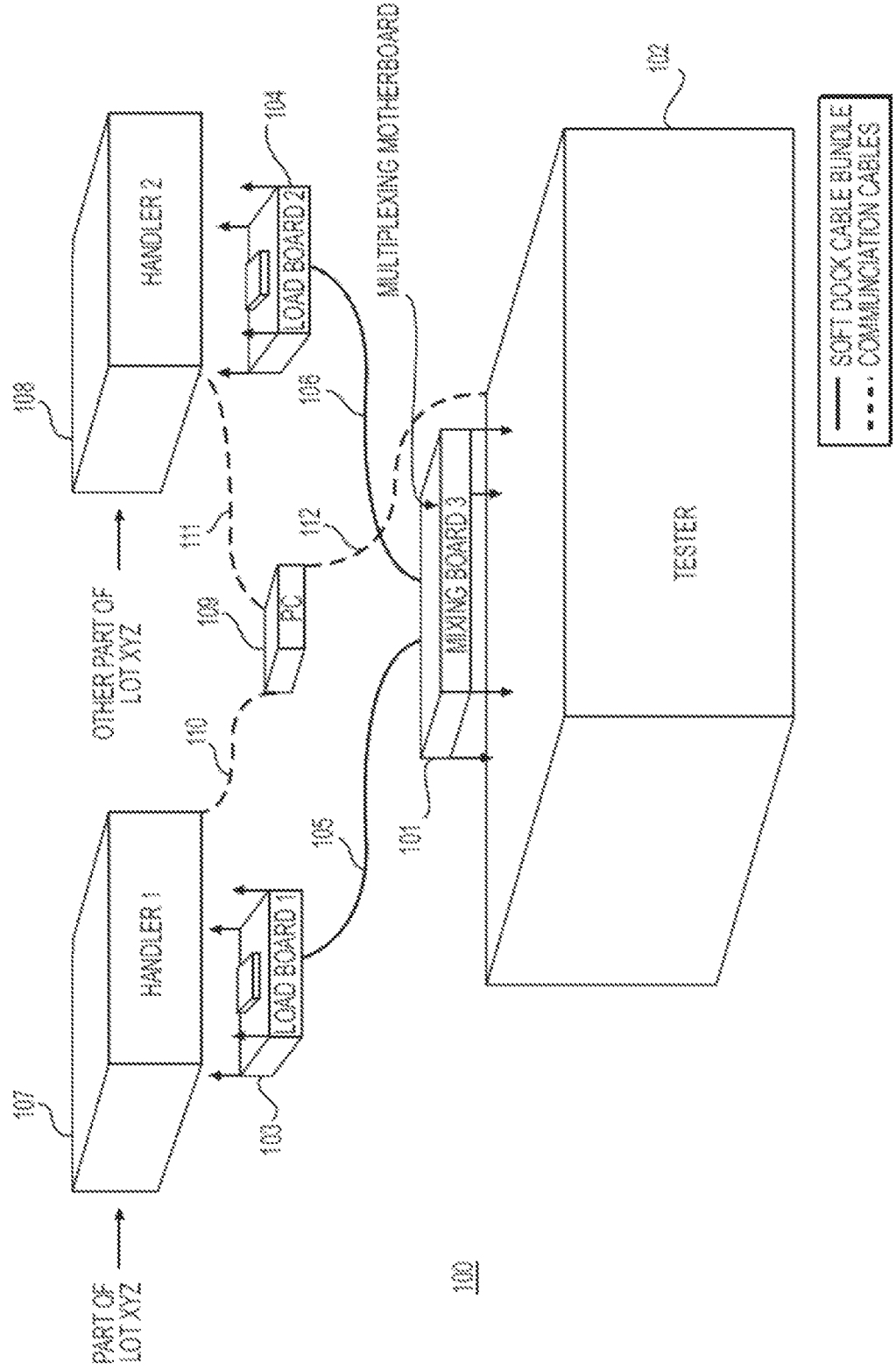
FIG. 10 provides an illustration of an exemplary multiplexed handler test cell.

FIG. 10 illustrates an exemplary multiplexed handler test cell 100 where a multiplexing motherboard 101 is used. The multiplexing mother board 101 is configured as a detachable module that may be easily attached to and removed from a semiconductor tester 102. The multiplexing motherboard 101 is in electrical communication with daughter load boards 103, 104 by the used of cable bundles 105, 106. The daughter load boards 103, 104 are attached to robotic "handler 1" 107 and robotic "handler 2" 108, respectively. The daughter load boards 103,104 are also configured as detachable modules that may be easily attached to and removed from robotic "handler 1" 107 and robotic "handler 2" 108, respectively. The multiplexed handler test cell 100 also includes a computer 109 that is in electrical communication with the tester 102 by communication cable 112. The computer 109 is also in electrical communication with robotic "handler 1" 107 and robotic "handler 2" 108 by communication cables 110 and 111.

The multiplexing motherboard 101 and the related daughter load boards 103, 104 are the primary focus of the invention described herein. Normally, the multiplexing motherboard fully multiplexes all tester resources so that one design will work across all applications. Each application, however, typically requires a unique handler load board. Referring again to FIG. 10, there are design requirements for the multiplexing motherboard that must be implemented in order for the design to function efficiently and effectively across the widest range of tester configurations and architectures.

These design requirements include, but are not limited to the following considerations. The first design requirement is the trace-length matching of signal traces for each digital signal. Trace-length matching is required for testers that have only one timing calibration set for the application. This is commonly referred to as a Time-Domain-Reflectometry (TDR) timing calibration. If only one calibration data set is available, then both handler 1 and handler 2 trace-lengths must match so that the single TDR data set works the same on both paths to the handlers. The method is described as trace-length matching to a tolerance equal to or better than the propagation speed of the signal given the PCB dielectric times ⅙ of the signal rise or fall time, whichever is shorter. For example, if an FR4 dielectric has a propagation velocity of approximately 1 inch/160 ps, and the rise and fall times are both 1 ns, then trace-length matching should be less than or equal to:

$$1 \text{ inch}/176\text{ps} * \frac{1}{6} * 1000\text{ps} = 0.95 \text{ inches.}$$

The second design requirement is the provision of a safety circuit that prevents the multiplexing relays for a handler to actuate when the cable for that handler has become disconnected. The safety circuit usually is associated with what is commonly referred to as an interlock circuit. The interlock circuit connects the tester with the handler. If this circuit is broken or interrupted, then the tester cannot power up tester resources that may carry hazardous voltages. When there are two handlers, a special circuit is provided that distinguishes between the interlock circuits for the two handlers. If the cabling to one handler becomes disconnected, the disconnected handler is prevented from powering on while the other handler that is connected continues to operate properly.

Figure 11:
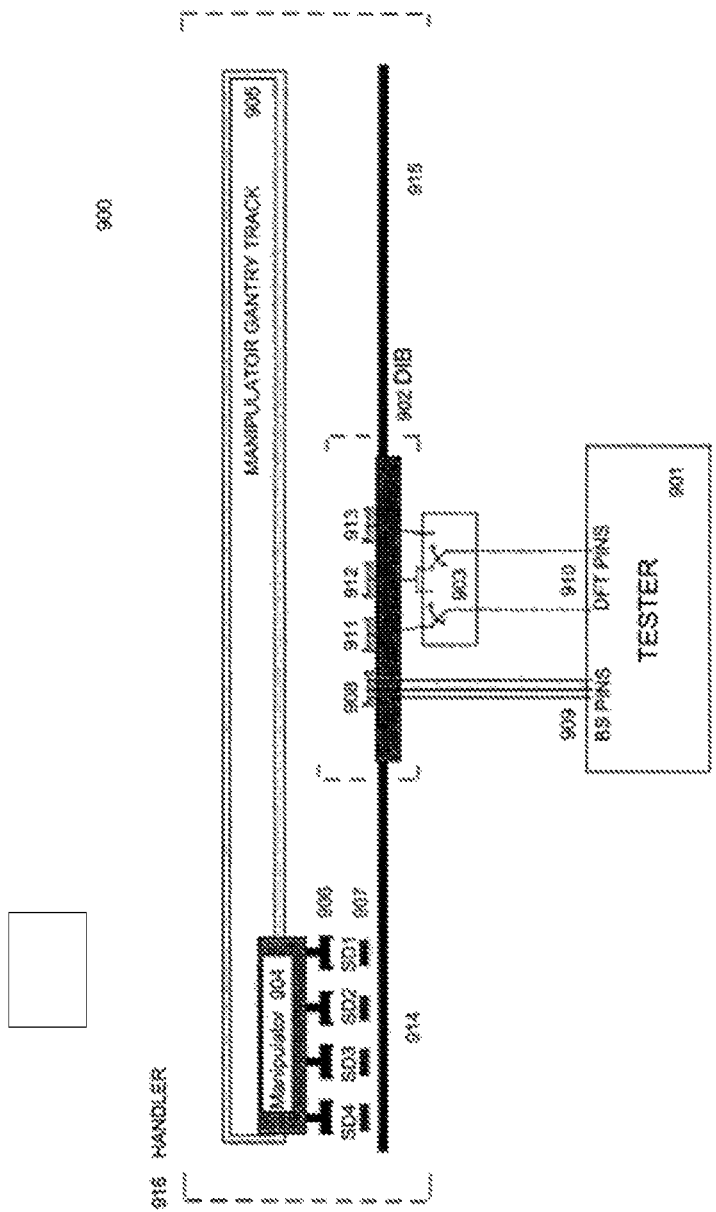
FIG. 11 shows an exemplary ATE handler with a single manipulator with chucks.
Figure 12:
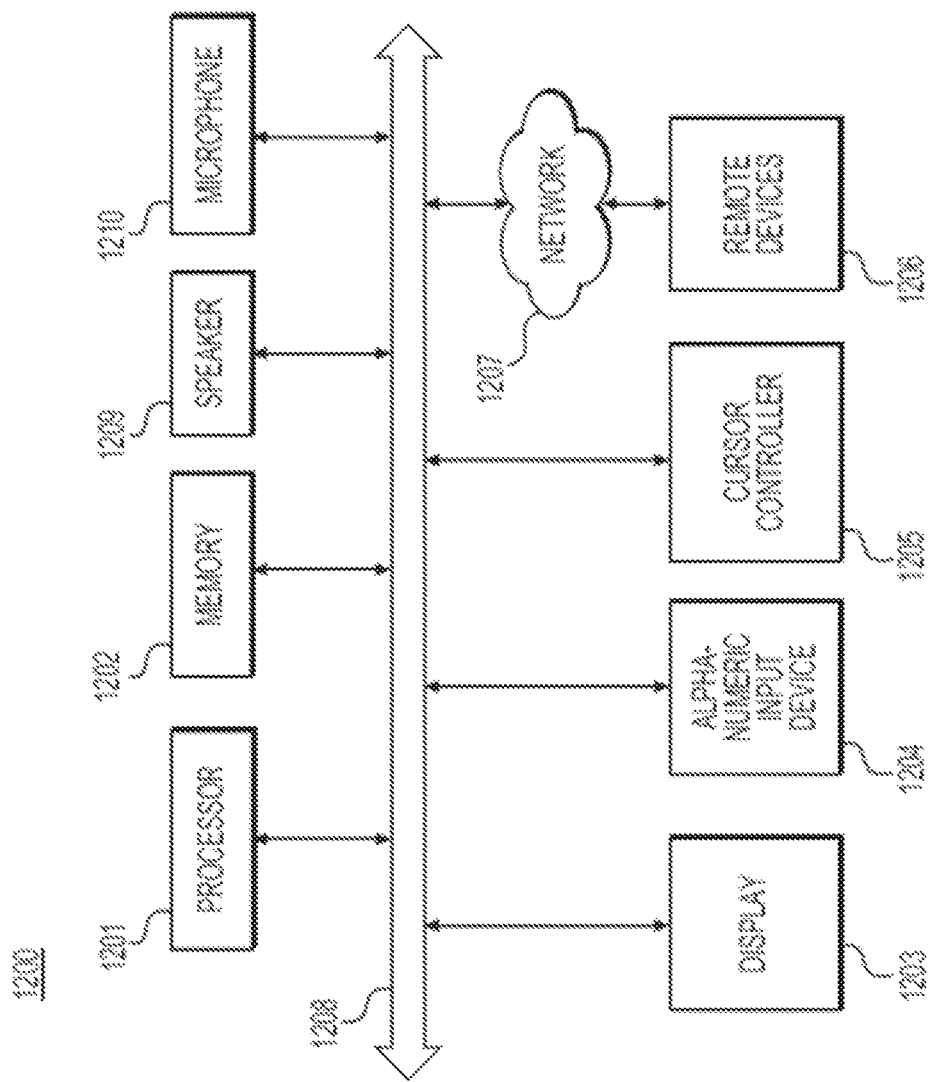
FIG. 12 show an illustration of an exemplary computing system.

An exemplary illustration of an ATE configured to implement a PCT stepping pattern is illustrated in FIG. 11. In FIG. 11, the test cell is characterized by having a single manipulator (one head), four (4) chucks, and a gantry based handler, where the input is at one end of the gantry and the output is at the other end of the gantry. In FIG. 11, the test cell 900 has three primary components, which are the handler 916, the DUT Interface Board (DIB) 902, and the tester 901. The switching relays 903 (a DPDT with two output legs tied together) can be located either on the DIB 902 or in the tester 901. The manipulator 904 includes four manipulator chucks 906, which are used to pick up, move, insert, and drop off semiconductor devices 907, identified as SD1, SD2, SD3, and SD4, being tested. The manipulator chucks retract, extend, pickup, and drop off, dependent upon the particular task being performed at the time. The manipulator 904 moves horizontally back and forth across the manipulator gantry track 905. The handler's input queue, where the manipulator picks up untested semiconductor devices, is identified as 914. The handler's output queue, where the manipulator drops off the tested semiconductor devices, is identified as 915. (In other embodiments, the manipulator may be configured as a robotic arm or robotic arms.)

The DUT Interface Board (DIB) 902 includes four (4) test contactors (sockets). Broadside test socket 908 is configured for broadside (BS) testing, and is in electrical contact with the many BS pins 909 of tester 901. Design-for-test (DFT) test sockets 911, 912, and 913 are configured for DFT testing and are connected to switching relays 903, which are in electrical contact with the DFT pins 910 of tester 901. There are fewer DFT pins 910 than there are BS pins 909.

FIG. 10 illustrates an exemplary embodiment of a computer 1200 that may be used in the semiconductor testing process that utilizes automated semiconductor test equipment and robotic handlers. The computer 1200 includes one or more sets of computer programming instructions that are stored in memory 1202 and that can be executed by processor 1201 in computer 1200 to perform the process described above. Computer 1200, which when properly programmed with specific testing software, becomes a special purpose computer that is configured for a specialized set of testing operations and functions.

The computer utilized in semiconductor test system may be present in one of many physical configurations, including being configured as a server or as a client terminal. The computer may also be associated with various devices, such as a desk-top computer, a laptop computer, a personal digital assistant, a mobile device, an electronic tablet, a smart phone, etc.

As illustrated in FIG. 10, the computer 1200 includes a processor 1201 and memory 1202, which is representative of one or more various memories that may be used by the computer 1200. These memories may include one or more random access memories, read only memories, and programmable read only memories, etc. Computer 1200 also includes at least one display 1203, which may be provided in any form, including a cathode ray tube, a LED display, an LCD display, and a plasma display, etc. The display may include provisions for data entry, such as by a touch-sensitive screen. Additional output devices may include an audio output device, such as a speaker 1209.

Computer 1200 further includes one or more input devices. Input devices may include one or more of an alpha-numeric input device 1204, such as a keyboard; a cursor controller 1205, such as a mouse, touch-pad, or joy-stick; and a microphone 1210. Computer 1200 also enables processor 1201 to communicate with one or more remote devices 1206 over a network 1207 external to computer 1200. Communications internal to computer 1200 primarily use bus 1208.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the invention has been described with reference to several exemplary embodiments, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed; rather the invention extends to all functionally equivalent structures, methods, and uses such as are within the scope of the appended claims.

While the non-transitory computer-readable medium may be shown to be a single medium, the term "computer-readable medium" includes a single medium or multiple media, such as a centralized or distributed database, and/or associated caches and servers that store one or more sets of instructions. The term "non-transitory computer-readable medium" shall also include any medium that is capable of storing, encoding or carrying a set of instructions for execution by a processor, or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present specification describes components and functions that may be implemented in particular embodiments with reference to particular standards and protocols, the disclosure is not limited to such standards and protocols. For example, standards for Internet and other packet-switched network transmission represent examples of the state of the art. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately-claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for performing continuous semiconductor tester operation during long soak time testing using a chamberless single insertion model (SIM) handler, the method comprising:
   dividing a group of semiconductors having an ambient temperature into a first subgroup having a plurality of portions and a second subgroup having a plurality of portions, the second subgroup being identical to the first subgroup;
   inserting, by the handler using chucks, a first portion of the first subgroup into a first test site, and inserting a first portion of a second subgroup into a second test site;
   changing the temperature of the first portion of the first subgroup and the first portion of a second subgroup prior to testing from ambient temperature to a stabilized designated temperature during a soak time;
   electrically connecting the first portion of the first subgroup to the tester, and electrically disconnecting the first portion of the second subgroup from the tester;
   testing the first portion of the first subgroup:
   electrically disconnecting the first portion of the first subgroup from the tester, and electrically connecting the first portion of the second subgroup to the tester;
   testing the first portion of the second subgroup;
   electrically disconnecting the first portion of the second subgroup from the tester; and
   removing the first portion of the first subgroup from the first test site and the first portion of the second subgroup from the second test site,
   wherein the first subgroup and the second subgroup have identical pin mappings and identical TDR calibration data.

2. The method according to claim 1,
   wherein the handler chucks are thermal chucks.

3. The method according to claim 2,
   wherein the changing the temperature of the first portion of the first subgroup and the first portion of the second subgroup prior to testing from the ambient temperature to the designated temperature is conducted by the thermal chucks.

4. The method according to claim 3, further comprising:
   modulating the designated temperature of the first portion of the first subgroup and the first portion of a second subgroup semiconductor devices by the thermal chucks to maintain the designated temperature during testing of the semiconductor devices.

5. The method according to claim 4,
   wherein the modulating the designated temperature includes measuring temperature of a subgroup undergoing testing and providing for a feedback control system to compensate for self-heating of the subgroup under going testing.

6. The method according to claim 1, further comprising:
   inserting, by the handler using chucks, a second portion of the first subgroup into the first test site, and inserting a second portion of a second subgroup into the second test site; and
   repeating the method until all of the plurality semiconductors have been tested.

7. The method according to claim 6,
   wherein the method for performing continuous semiconductor testing during long soak time testing using a single insertion model (SIM) handler that divides a group of semiconductors having an ambient temperature into a first subgroup having a plurality of portions and a second subgroup having a plurality of portions masks 50% of the overall Soak Time and 50% of the overall mechanical Index Time.

8. The method according to claim 1,
   wherein a long soak time is defined as any soak time that reduces the operating throughput of a handler by more than 20%.

9. The method according to claim 1,
   wherein the testing of subgroups at the first test site and the second test site is performed through a multiplexing scheme, with trace length matching for all pairs of multiplexed signals.

10. A method for performing continuous semiconductor tester operation during long soak time testing using a chamberless asynchronous insertion model (AIM) handler using two manipulators, the method comprising:
    dividing a group of semiconductors having an ambient temperature into a first subgroup having a plurality of portions and a second subgroup having a plurality of portions, the second subgroup being identical to the first subgroup;
    inserting, by the handler using chucks, a first portion of the first subgroup into a first test site, and inserting a first portion of a second subgroup into a second test site;

changing the temperature of the first portion of the first subgroup and the first portion of a second subgroup prior to testing from ambient temperature to a stabilized designated temperature during a soak time;

electrically connecting the first portion of the first subgroup to the tester, and electrically disconnecting the first portion of the second subgroup from the tester;

testing the first portion of the first subgroup;

electrically disconnecting the first portion of the first subgroup from the tester and removing the first portion of the first subgroup from the first test site, while electrically connecting the first portion of the second subgroup to the testing the first portion of the second subgroup;

electrically disconnecting the first portion of the second subgroup from the tester; and removing the first portion of the second subgroup from the second test site, wherein the testing of subgroups at the first test site and the second test site is performed through a multiplexing scheme, with trace length matching for all pairs of multiplexed signals.

11. The method according to claim 10, wherein the handler chucks are thermal chucks; and wherein the changing of the temperature of the first portion of the first subgroup and the first portion of the second subgroup prior to testing from the ambient temperature to the designated temperature was conducted by the thermal chucks.

12. The method according to claim 11, further comprising:

modulating the designated temperature of the first portion of the first subgroup and the designated temperature first portion of the second subgroup of the semiconductor devices by the thermal chucks to maintain the designated temperature during testing of the semiconductor devices.

13. The method according to claim 12, wherein the modulating the designated temperature includes measuring temperature of a subgroup undergoing testing and providing for a feedback control system to compensate for self-heating of the subgroup undergoing testing.

14. The method according to claim 10, further comprising:

inserting, by the handler using chucks, a second portion of the first subgroup into the first test site, and inserting a second portion of a second subgroup into the second test site; and repeating the method until all of the plurality semiconductors have been tested.

15. The method according to claim 14, wherein the method for performing continuous semiconductor testing during long soak time testing using an AIM model handler partially masks the overall Soak Time and the Index Time when the Test Time is less than the sum of the Soak Time and the Index Time.

16. The method according to claim 14, wherein the method for performing continuous semiconductor testing during long soak time testing using an AIM model handler fully masks the overall Soak Time and the overall Index Time when the Test Time equals the sum of the Soak Time and the Index Time.

17. The method according to claim 14, wherein the method for performing continuous semiconductor testing during long soak time testing using an AIM model handler fully masks the overall Soak Time and the overall mechanical Index Time when the Test Time is greater than the sum of the Soak Time and the Index Time, and introduces Wait Times into the method.

18. The method according to claim 10 wherein a long soak time is defined as any soak time that reduces the operating throughput of a handler by more than 20%.

* * * * *

UNITED STATES PATENT AND TRADEMARK OFFICE
CERTIFICATE OF CORRECTION

PATENT NO. : 11,448,688 B2
APPLICATION NO. : 17/258977
DATED : September 20, 2022
INVENTOR(S) : Howard H. Roberts, Jr.

It is certified that error appears in the above-identified patent and that said Letters Patent is hereby corrected as shown below:

In the Claims

Column 20, Line 29 Claim 5, Line 6, the expression "under going" should read -- undergoing --.

Column 22, Line 34 Claim 18, Line 1, the expression "claim 10" should read -- claim 10, --.

Signed and Sealed this
Twenty-first Day of February, 2023

Katherine Kelly Vidal
*Director of the United States Patent and Trademark Office*